United States Patent

Kelly et al.

[15] 3,681,699

[45] Aug. 1, 1972

[54] TAPE CHANNEL SWITCHING CIRCUIT

[72] Inventors: William J. Kelly, Sauquoit; Warren A. Reynolds, Ilion, both of N.Y.

[73] Assignee: Cogar Corporation, Wappingers Falls, N.Y.

[22] Filed: Feb. 26, 1971

[21] Appl. No.: 119,110

[52] U.S. Cl. ..................328/143, 328/151, 307/243, 307/251, 328/104, 328/154

[51] Int. Cl. ..............................................G06g 7/12

[58] Field of Search ...............307/243; 328/143, 151

[56] References Cited

UNITED STATES PATENTS

| | | | |
|---|---|---|---|
| 3,139,536 | 6/1964 | York | 307/243 |
| 3,550,016 | 12/1970 | Gugliotti | 307/243 |
| 3,562,554 | 2/1971 | Von Feldt | 307/243 |
| 3,007,056 | 10/1961 | Logue et al. | 307/243 |

*Primary Examiner*—Donald D. Forrer
*Assistant Examiner*—Harold A. Dixon
*Attorney*—Gottlieb, Rackman & Reisman

[57] ABSTRACT

A tape channel switching circuit having two operational amplifiers, each of which has its inputs coupled to a respective tape head. The outputs of the two amplifiers are coupled together and extended to the input of a shared amplifier. A control circuit has two output terminals, each connected to one of the input terminals of a respective amplifier. To select one amplifier to the exclusion of the other, the control circuit causes the output of the other operational amplifier to saturate.

13 Claims, 2 Drawing Figures

INVENTORS
WILLIAM J. KELLY
WARREN A. REYNOLDS
BY Gottlieb, Rackman & Reisman
Harry M Weiss
ATTORNEYS

TAPE CHANNEL SWITCHING CIRCUIT

This invention relates to tape channel switching circuits, and more particularly to such circuits which require reduced numbers of switching elements.

There are many applications in which at least two levels of amplification are necessary, but the signal of only one of several sources must be operated upon at any one time. In such a case, several first-level amplifiers may be provided, the input to each of the amplifiers being derived from a tape head or some other signal source. Since the signal from only one source needs to be amplified at any time, all that is required is to couple the output of the selected one of the several first-level amplifiers to the input of a shared, second-level amplifier.

The prior art approach in this regard is to couple the output of each of the first-level amplifiers through a respective switching device such as an FET transistor to the input of the shared amplifier. By controlling one of the transistors to be held on and all others to be held off, the output of only one of the first-level amplifiers is extended to the shared amplifier. But this technique not only requires the use of several switching transistors, it often requires special drive circuits for turning the transistors on and off.

It is a general object of our invention to provide a relatively simple switching circuit of the type described, one which requires fewer switching devices than have been used in the prior art.

Briefly, in the illustrative embodiment of or invention, two operational amplifiers are employed, the outputs of the two amplifiers being coupled together at the input of a shared, second-level amplifier. A signal source, such as a tape head, is connected to the plus and minus inputs of each operational amplifier. A control circuit has two output terminals, each coupled through a resistor to one of the inputs of a respective one of the amplifiers. To select one of the amplifiers to the exclusion of the other, a ground potential is applied to the respective control output terminal while a large potential is applied to the other control output terminal. While the first amplifier is thus enabled to operate in a linear mode, the second amplifier is caused to saturate. The saturated output of this amplifier prevents any source signal from being extended through it to the shared amplifier. Because the output of one of the operational amplifiers is saturated by applying a control potential to one of its inputs, it is not necessary to provide additional switching transistors connected between the outputs of the two amplifiers and the input of the shared amplifier.

It is a feature of our invention to select one of two operational amplifiers, whose outputs are coupled to the input of a shared amplifier, by applying a potential to one of the inputs of the other operational amplifier which causes its output to saturate.

Further objects, features and advantages of our invention will become apparent upon consideration of the following detailed description in conjunction with the drawing, in which.

Figure 1:
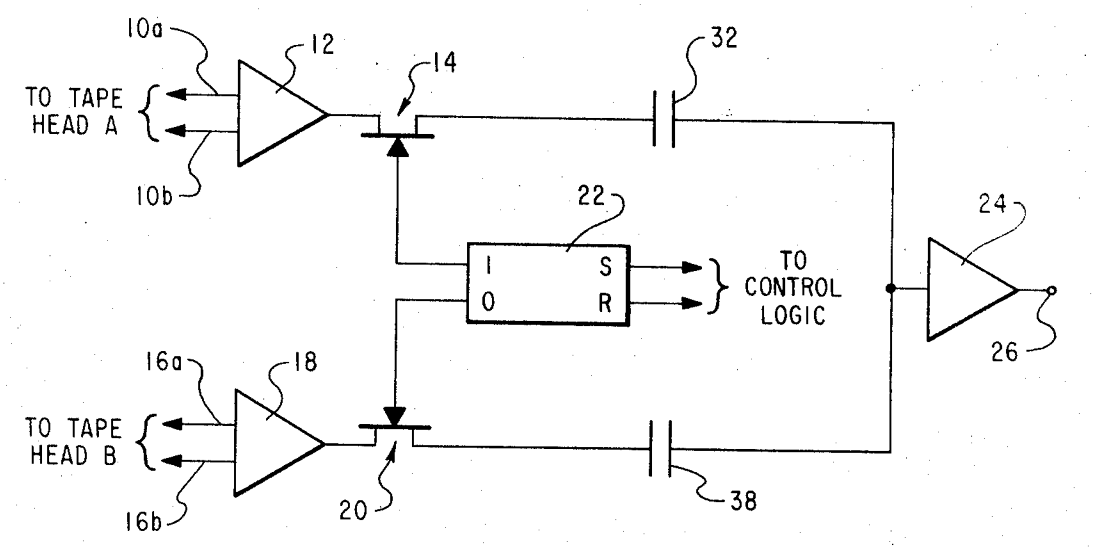
FIG. 1 PRIOR ART
FIG. 1 depicts a typical prior art circuit.

Referring to the prior art circuit of FIG. 1, two difference amplifiers 12, 18 are shown as having their outputs connected through respective FET transistors

14,20, and capacitors 32, 38, to the input of shared amplifier 24. The two inputs of amplifier 12 are connected over conductors 10*a*, 10*b* to a first source, such as a tape head A. The two inputs of amplifier 18 are connected over conductors 16*a*, 16*b* to a second signal source, such as a tape head B.

Although each difference amplifier operates continuously to amplify the signal applied to its inputs, only one of the two FET transistors is held on at any time. Control logic (not shown) causes signals to be applied to the set and reset terminals of flip-flop 22 such that only one of the 1 and 0 outputs is energized. Whichever output terminal is high in potential causes the FET transistor to which it is connected to be turned on. Whichever output terminal is low in potential causes the FET transistor to which it is connected to be held off. Consequently, only one of the transistors conducts to extend the output of its respective difference amplifier through the respective one of capacitors 32, 38 to the input of amplifier 24. The output signal at terminal 26 is thus a function of only a selected one of the two signal sources.

It should be noted that difference amplifiers 12, 18 are employed in the circuit of FIG. 1 rather than operational amplifiers. An operational amplifier includes a feedback circuit connected between the output terminal and one of the inputs. Such feedback is to be avoided because, unless compensated, the input impedances of the input terminals of each operational amplifier would be different. This would degrade the common mode signal rejection of each amplifier.

It should also be noted that it is not practical to utilize only one of amplifiers 12, 18 and to use FET transistors 14, 20 to couple the two signal sources to the inputs of the single amplifier. In the case of very low-level signals, such as those at the output of a tape head, balanced inputs are required for the first stage of amplification. Otherwise, the circuits and conductors between the signal sources and the input terminals of the amplifier would function as antennas to pick up all extraneous signals and the resulting noise might mask the input signals. Very elaborate switching circuits would be required to couple the two signal sources to the input terminals of a single amplifier without excessive noise being present, and these switching circuits are typically more expensive than the amplifier which would be saved. Accordingly, each amplifier is permanently connected to a respective signal source, with a single FET transistor being employed to couple the output of each amplifier to the input of amplifier 24. Each of capacitors 32, 38 serves to filter out any DC component in the amplified signal extended through it when the respective FET transistor is conducting so that all signals applied to the input of amplifier 24 have a DC level at ground potential.

Figure 2:
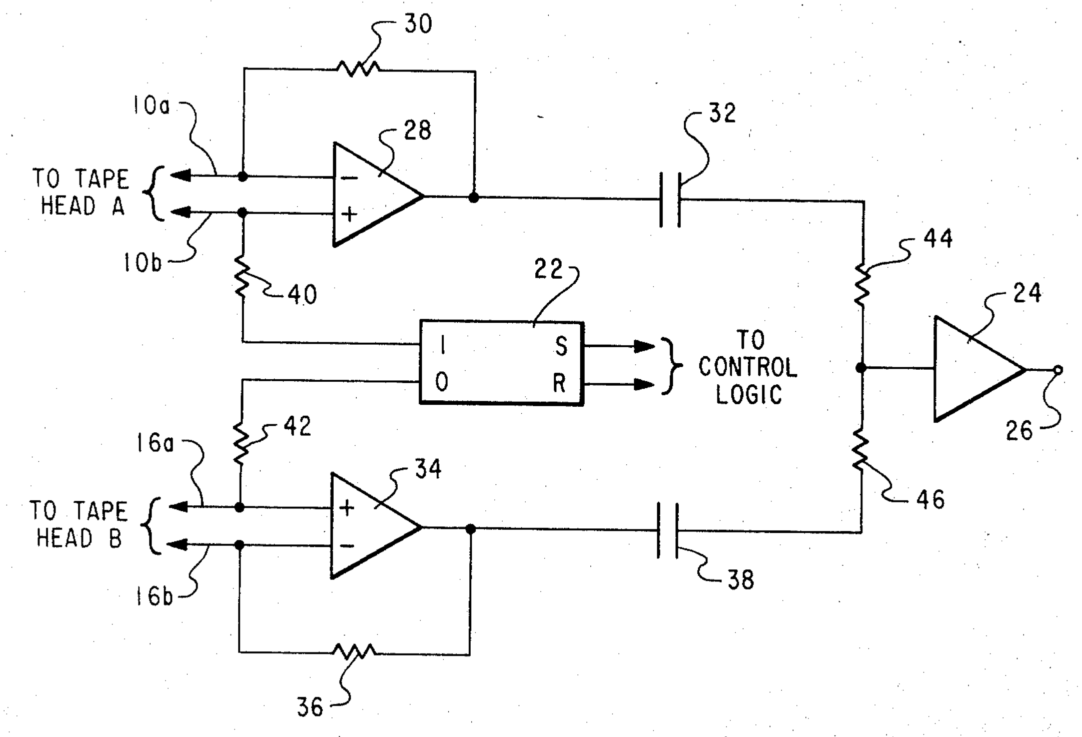
FIG. 2 depicts the illustrative embodiment of the invention.

In the circuit of FIG. 2, operational amplifiers 28, 34 are employed, and each operational amplifier is provided with a respective feedback resistor 30, 36. The FET transistor switches are not required, and instead the outputs of flip-flop 22 are coupled through respective resistors 40, 42 to the plus inputs of the operational amplifiers.

Consider the case in which the 1 output of the flip-flop is at ground potential and the 0 output is at a high potential, The ground at the 1 output has no effect on the operation of amplifier 28. Resistor 40 simply serves to couple the plus input of the amplifier to ground. The magnitude of resistor 40 is the same as that of resistor 30 so that the impedances at the two inputs of amplifier 28 are equal. Operational amplifier 28 operates in its linear mode and the signal from tape head A is amplified and extended through capacitor 32 and resistor 44 to the input of amplifier 24.

The high potential at the 0 output of flip-flop 22 is extended through resistor 42 to the plus input of amplifier 34. The potential is high enough to cause the output of amplifier 34 to saturate. Consequently, all AC signals from tape head B have no effect on the output and are not transmitted through capacitor 38 and resistor 46 to the input of amplifier 24. In a similar manner, with reverse potentials at the outputs of the flip-flop, amplifier 34 functions to extend the signal from tape head B to amplifier 24 while the output of amplifier 28 is saturated to effectively block signals from tape head A from being transmitted to amplifier 24.

Capacitors 32, 38 once again function to block DC signals from being extended to the input of amplifier 24.

Without transistors 14, 20, it is advisable to include resistors 44, 46 in the circuit. Consider the case in which amplifier 34 functions to extend a signal from its respective source to the input of amplifier 24 while the output of amplifier 28 is saturated. The output impedance of operational amplifier 28 is typically in the order of 100 ohms. Without resistors 44, 46, the output of amplifier 34 would feed not only the input of amplifier 24, but also the output of amplifier 28. Amplifier 34, in such a case, would have to supply a large current in order for a signal of appreciable magnitude to be applied at the input of amplifier 24. By including resistors 44, 46 in the circuit, the outputs of the two operational amplifiers are isolated from each other with respect to AC signals.

It is possible to connect resistors 40, 42 to the minus inputs of the two operational amplifiers rather than the plus inputs, in which case feedback resistors 30, 36 might be connected to the plus inputs of the operational amplifiers. The output impedances of an operational amplifier are not necessarily equal when the output is saturated in the two opposite directions. If the output impedances of each amplifier are not equal, each flip-flop output signal preferably should be coupled to that one of the plus and minus inputs of the respective amplifier which provides the lowest output impedance when the amplifier is saturated. If the output impedance of an operational amplifier has a magnitude Z, and the feedback impedance has a magnitude Z′, then the gain of the amplifier is $Z/(Z+Z')$. In order to attenuate the source signal which is not used to the greatest extent, each output impedance should be as low as possible. It is for this reason that the direction in which the output of each amplifier is saturated should be made to provide the lowest possible output impedance.

By jamming the output of one of the operational amplifiers, it is apparent that it is not necessary to incorporate two FET transistors or similar switching devices in the circuit. This reduces the overall cost of the circuit without in any way degrading performance.

Although the invention has been described with reference to a particular embodiment, it is to be understood that this embodiment is merely illustrative of the application of the principles of the invention. For example, with three or more signal sources, the outputs of all but one of several operational amplifiers would be jammed as described. Thus it is to be understood that numerous modifications may be made in the illustrative embodiment of the invention and other arrangements may be devised without departing from the spirit and scope of the invention.

What we claim is:

1. A switching circuit for extending a selected one of at least two input signals to a common terminal comprising at least first and second operational amplifiers, each of said operational amplifiers having a pair of input terminals and an output terminal, means for coupling each of said at least two input signals to the input terminals of a respective one of said operational amplifiers, control means connected to one of the input terminals of each of said operational amplifiers for selectively applying two different potentials thereto, a first of said potentials allowing the respective operational amplifier to operate in a linear mode and a second of said potentials causing the output of the respective operational amplifier to be saturated, and means for coupling the output terminals of said first and second operational amplifiers to said common terminal.

2. A switching circuit in accordance with claim 1 further including feedback means connecting the output terminal of each of said operational amplifiers to that one of the respective pair of input terminals to which said control means is not connected.

3. A switching circuit in accordance with claim 2 wherein said control means applies said different potentials to said operational amplifier input terminals through impedances related to said feedback means such that the pair of input terminals of each of said operational amplifiers are balanced.

4. A switching circuit in accordance with claim 3 wherein said coupling means includes resistor means connected between the output terminal of each of said operational amplifiers and said common terminal.

5. A switching circuit in accordance with claim 4 wherein said coupling means further includes capacitor means for eliminating DC components in the signals extended to said common terminal.

6. A switching circuit in accordance with claim 5 wherein the input terminal of each operational amplifier to which said control means is connected is that one which causes the operational amplifier to exhibit the lowest output impedance when it is saturated.

7. A switching circuit in accordance with claim 1 wherein the input terminal of each operational amplifier to which said control means is connected is that one which causes the operational amplifier to exhibit the lowest output.

8. A switching circuit in accordance with claim 1 wherein said coupling means includes resistor means connected between the output terminal of each of said operational amplifiers and said common terminal.

9. A switching circuit in accordance with claim 8 wherein said coupling means further includes capacitor means for eliminating DC components in the signals extended to said common terminal.

10. A switching circuit in accordance with claim 8 wherein the input terminal of each operational amplifier to which said control means is connected is that one which causes the operational amplifier to exhibit the lowest output impedance when it is saturated.

11. A switching circuit for extending a selected one of at least two input signals to a common terminal comprising at least first and second amplifying means, each of said amplifying means having input means and output means, means for coupling each of said at least two input signals to the inputs means of a respective one of said amplifying means, control means connected to the input means of each of said amplifying means for collectively applying two different control signals thereto, a first of said control signals allowing the respective amplifying means to operate in a linear mode and a second of said control signals causing the output of the respective amplifying means to be saturated, and means for coupling the output means of said first and second amplifying means to said common terminal.

12. A switching circuit in accordance with claim 11 wherein said coupling means includes resistor means connected between the output means of each of said amplifying means and said common terminal.

13. A switching circuit in accordance with claim 12 wherein said coupling means further includes capacitor means for eliminating DC components in the signal extended to said common terminal.

* * * * *